United States Patent
Sada et al.

[11] Patent Number: 6,062,240
[45] Date of Patent: May 16, 2000

[54] TREATMENT DEVICE

[75] Inventors: Tetsuya Sada; Norio Uchihira; Mitsuhiro Sakai; Kiyomitsu Yamaguchi, all of Kumamoto-ken, Japan

[73] Assignee: Tokyo Electron Limited, Japan

[21] Appl. No.: 09/035,902

[22] Filed: Mar. 6, 1998

[51] Int. Cl.[7] .................................................. B08B 3/02
[52] U.S. Cl. ..................... 134/95.2; 134/95.3; 134/153; 134/902
[58] Field of Search ................... 134/902, 95.2, 134/95.3, 153; 118/52; 156/345 L, 345 LS

[56] References Cited

U.S. PATENT DOCUMENTS

| | | | |
|---|---|---|---|
| 4,564,280 | 1/1986 | Fukuda | 134/902 X |
| 4,735,220 | 4/1988 | Chandler | 134/902 X |
| 5,211,753 | 5/1993 | Swain | 134/902 X |
| 5,351,360 | 10/1994 | Suzuki et al. | 134/902 X |

FOREIGN PATENT DOCUMENTS

0398806  11/1990  European Pat. Off. ............... 134/902

*Primary Examiner*—Philip R. Coe
*Attorney, Agent, or Firm*—Rader, Fishman & Grauer

[57] ABSTRACT

A treatment device comprising a holding method for holding a substrate such as an LCD substrate; and a treatment solution supply method for supplying a treatment solution on a surface of the substrate wherein the holding method has a substrate-placing portion on which the substrate is disposed, the substrate-placing is made of a synthetic resinous material. Since the holding method has a substrate-placing portion which is made of a synthetic resinous material, the electric charge amount of the substrate can be reduced to prevent various static electricity caused troubles such as the electrostatic destruction of the device formed on the substrate. Further, a discharge noise trouble due to discharge phenomenon from the substrate to a transporting method can be prevented. Further, it is possible to reduce the electric charge amount of the holding method and destaticize the holding method by supplying a destaticizing fluid such as ionized pure water or ionized gas towards above or below the holding method. Thus, it is possible to prevent various static-electricity caused troubles such as the electrostatic destruction of the device formed in the device from occurring and further, possible to prevent noise troubles from occurring because the generation degree of the discharge which occurs between the substrate and the transport method can be reduced further. The electric charge amount of the substrate can be reduced by making the thickness (distance) of the substrate-placing portion formed of a dielectric thick (long).

29 Claims, 8 Drawing Sheets

of 3,000 characters worth of patent text …

TREATMENT DEVICE

BACKGROUND OF THE INVENTION

1. Field of the Invention

In manufacturing an LCD substrate, a semiconductor layer, an insulation layer, and an electrode layer formed on the LCD substrate are electively etched to form a predetermined pattern thereon. In the etching process, a size-reduced circuit pattern is transferred to a photoresist by photolithography technique as in the case of a semiconductor wafer. Then, the LCD substrate is developed.

2. Description of the Related Art

More specifically, after the LCD substrate is cleaned by a cleaning device, an adhesion treatment device performs a pre-treatment to improve the fixing performance of the photoresist to the LCD substrate. Then, the LCD substrate is cooled by a cooling device. Thereafter, a resist application device coats the LCD with the photoresist substrate to form a photoresist film, namely, a photosensitive film thereon. After the photoresist film is heated by baking treatment which is performed by a heating treatment device, an exposing device exposes the photoresist film to light beams in correspondence to a predetermined pattern. After the LCD substrate is developed by a developing device, a developing solution is cleaned with a rinsing liquid such as pure water to complete the developing treatment.

Spin rinsing method is known as a method of cleaning the developing solution. In this method, a treatment solution such as a developing solution is supplied to the surface of the LCD substrate held by a spin chuck serving as a holding means. Then, the LCD substrate is horizontally rotated to wash away the developing solution or the like with pure water.

However, in the treating device which is used in the spin rinsing method, the spin chuck is made of aluminum alloy. Thus, when a rinsing liquid consisting of pure water is supplied to the LCD substrate by rotating the spin chuck, the LCD substrate is charged by a friction between the pure water and the LCD substrate. As a result, there is a possibility that a device formed in the charged LCD substrate is destroyed by static electricity. Even in the case of an LCD substrate not accommodating the device, a discharge occurs between the LCD substrate and a feeding arm, which causes the feeding arm to generate noises. Thus, a feeding device having the feeding arm may have a trouble.

SUMMARY OF THE INVENTION

It is an object of the present invention to provide a treatment device in which the electric charge amount of a substrate such as an LCD substrate is reduced significantly to prevent electric charge-caused troubles from occurring.

In order to achieve the object, according to the present invention, there is provided a treatment device comprising a holding means for holding a substrate, for example, an LCD substrate which is to be treated; and a treatment solution supply means for supplying a surface of said substrate with a treatment solution. The holding means has a substrate-placing portion. The substrate-placing portion is made of a synthetic resinous material. According to the present invention, because the substrate-placing portion of the holding means is made of the synthetic material, it is possible to electrically charge the substrate in a reduced amount. Accordingly, by reducing the electric charge amount of the substrate, it is possible to prevent, to a high degree, occurrence of various static electricity-caused troubles such as electrostatic destruction of a device formed in the substrate. Further, it is possible to prevent, to a high degree, noise troubles from occurring because generation degree of a discharge which occurs between the substrate and the transport means can be reduced. Furthermore, it is possible to reduce the electric charge amount of the holding means and destaticize the holding means by supplying a destaticizing fluid such as ionized pure water or ionized gas above or below the holding means, which allows the electric charge amount of the substrate to be reduced further. Thus, it is possible to prevent, to a higher degree, various static electricity-caused troubles such as the electrostatic destruction of the device formed in the substrate from occurring and further, possible to prevent, to a higher degree, noise troubles from occurring because the generation degree of the discharge which occurs between the substrate and the transport means can be reduced further. The electric charge amount of the substrate can be reduced by making the thickness (distance) of the substrate-placing portion formed of a dielectric thick (long).

These and other objects, features, and advantages of the present invention will become more apparent in light of the following detailed description of a best mode embodiment thereof, as illustrated in the accompanying drawings.

DESCRIPTION OF PREFERRED EMBODIMENTS

Figure 1:
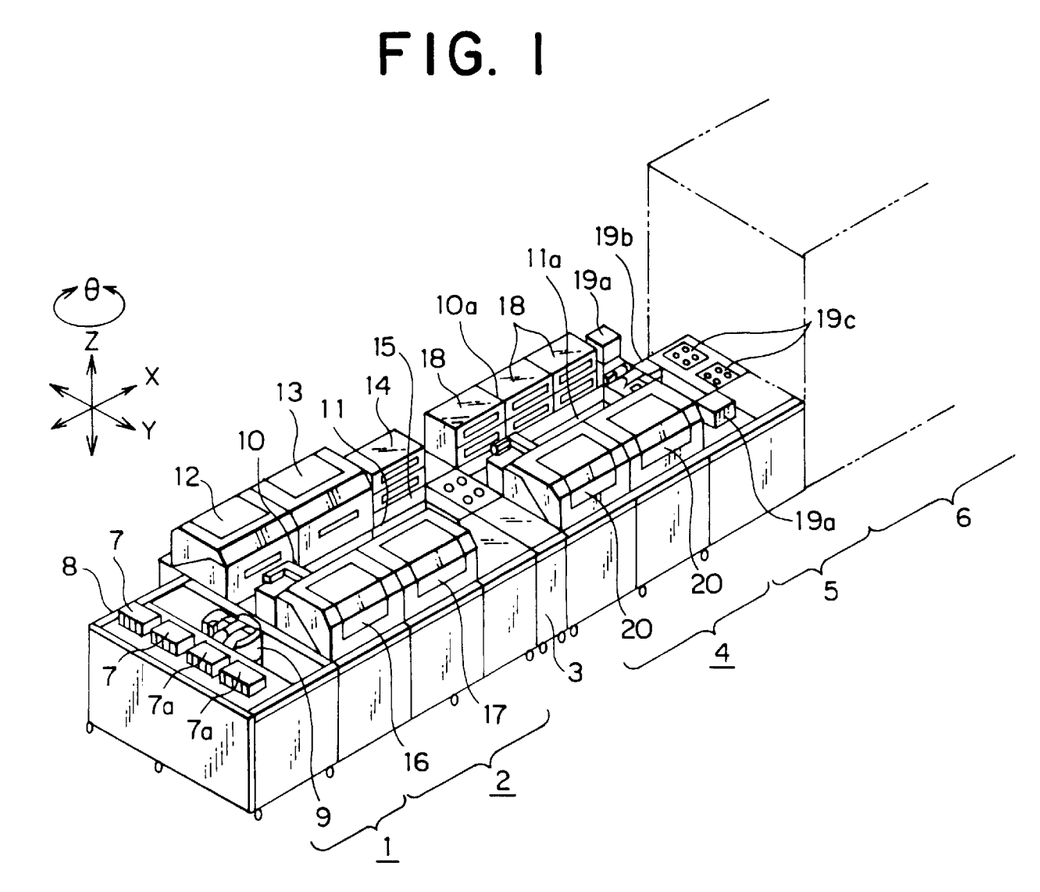
FIG. 1 is a perspective view showing a resist applying/developing system incorporating a treatment device of the present invention.

The treatment devices according to embodiments of the present invention will be described below with reference to drawings. In the embodiments, the treatment devices of the present invention are applied to a system of applying a resist to an LCD substrate and developing it. FIG. 1 is a perspective view showing a resist applying/developing system incorporating a treatment device of the present invention.

As shown in FIG. 1, the resist applying/developing system comprises a loader section 1 for feeding in and out an LCD substrate G (hereinafter referred to as substrate G); a first treating section 2 for treating the substrate G; and a second treating section 4 positioned adjacently to a relay section 3 positioned adjacently to the first treating section 2. An exposing device 6 for exposing a resist film to light beams in correspondence to a predetermined fine pattern on the substrate G positioned adjacently to a transferring section 5 positioned adjacently to the second treating section 4. The substrate G is formed of an insulation material.

In the resist applying/developing system, the untreated G accommodated in a cassette 7 placed on a cassette-placing platform 8 is taken out therefrom by a forceps 9 of the loader section 1, and then transferred to a main arm 10 moving along a transport path 11 of the first treating section 2. The main arm 10 is movable in an X-direction (horizontal direction), a Y-direction (horizontal direction), and Z-direction (vertical direction) and rotatable at an angle of θ in X-Y planes. The main arm 10 transports the substrate G into a brush-cleaning device 12.

The substrate G cleaned with a brush inside the brush-cleaning device 12 is cleaned with high-pressure jet water in a jet water cleaning device 13, depending on necessity. In an adhesion treatment device 14, pre-treatment for improving the fixing performance of a photoresist to the substrate G is performed and then cooled in a cooling device 15. Then, in a resist-applying device 16, a photoresist film, namely, a photosensitive film is formed on the substrate G by coating it with the photoresist. Then, a film-removing device 17 removes an unnecessary portion of the photoresist film situated at the edge of the substrate G.

After the photoresist film is heated by baking treatment by a heating treatment device 18, the photoresist film is exposed to light beams to form a predetermined pattern thereon in the exposing device 6. Then, the substrate G is fed to a developing device 20 by the main arm 10 moving along a transport path 11a of the second treating section 4. As described previously, the main arm 10a is movable in the X-direction, the Y-direction, and the Z-direction and rotatable at the angle of θ in X-Y planes. In the developing device 20, after the substrate G is developed with a developing solution, the developing solution is washed away with a rinsing liquid. After the developing treatment terminates, the substrate G is accommodated in a cassette 7a of the loader section 1 and then transported to be treated in a subsequent process.

The construction of the treatment device (developing device), of the present invention, which is used in the resist-applying/development treatment system will be described below.

First Embodiment

Figure 2:
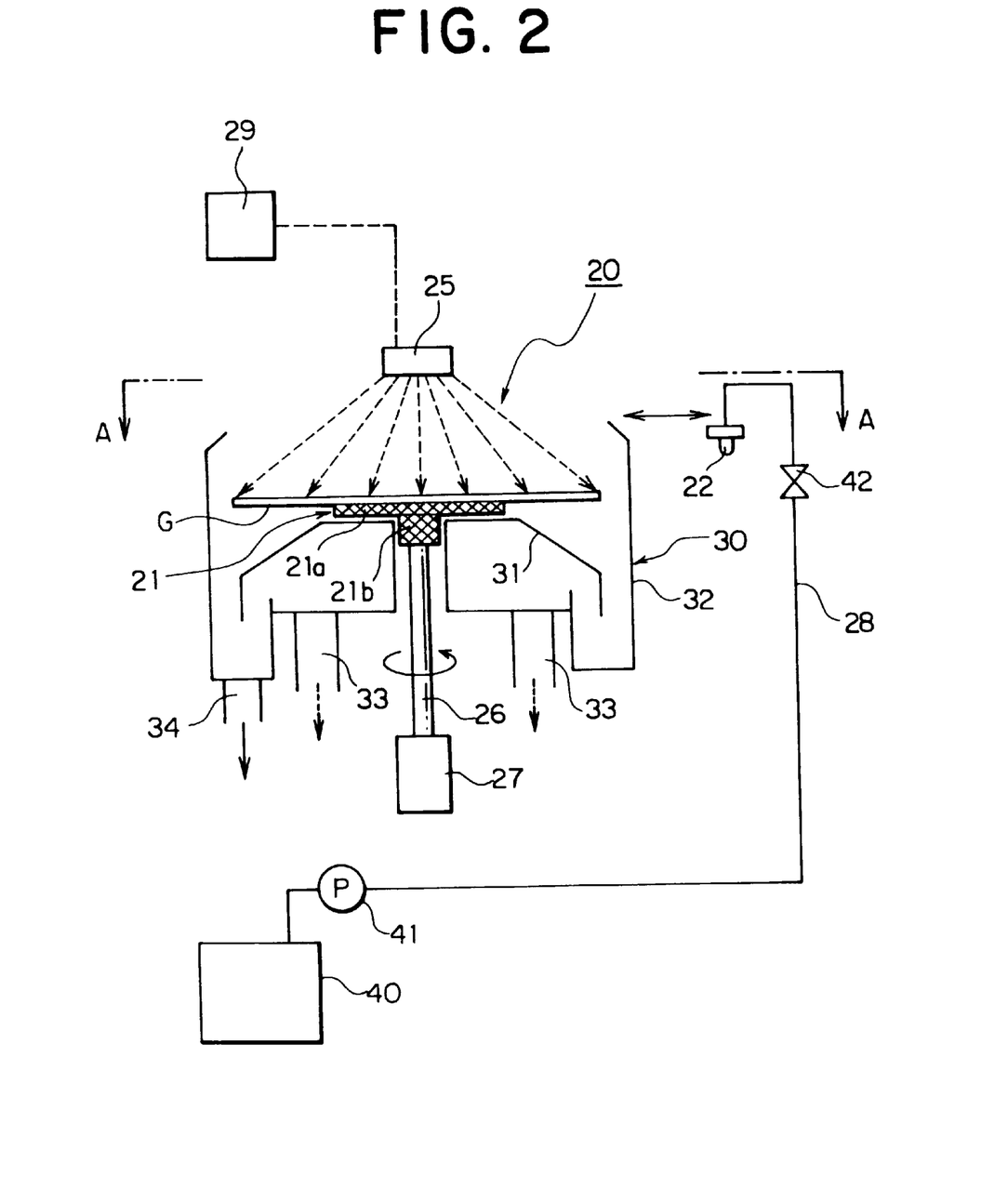
FIG. 2 is a sectional view showing a first embodiment of the treatment device of the present invention.
Figure 3:
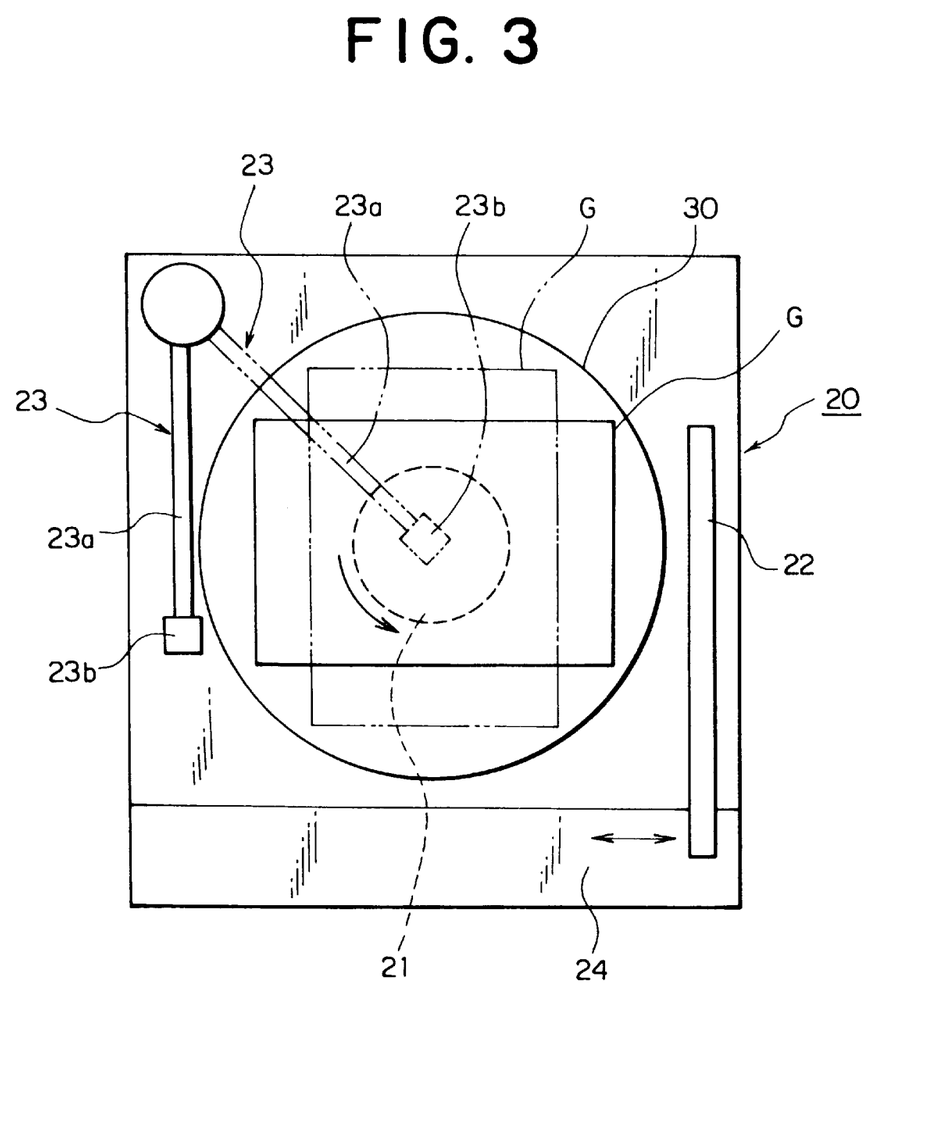
FIG. 3 is a plan view taken along a line A—A of FIG. 2.

As shown in FIGS. 2 and 3, the developing device 20 comprises a spin chuck 21 rotatable horizontally and serving as a holding means for holding the substrate G by vacuum sucking; a container 30 containing the spin chuck 21 and the substrate G; a developing solution supply nozzle 22 (treating solution supply means) for supplying the developing solution to the resist film formed on the surface of the substrate G; a cleaning liquid supply nozzle 23 for supplying the rinsing liquid (cleaning solution) to the circuit pattern formed on the surface of the developed substrate G; a moving mechanism 24 for moving the developing solution supply nozzle 22 between a waiting position set at the right side in FIG. 3 and a treating position located above the substrate G; and an ionizer (destaticizing fluid supply means) 25 located at an upper position of the spin chuck 21 and spraying a destaticizing fluid, for example, an ionized gas to the substrate G and the spin chuck 21. The operation of the ionizer 25 is controlled by a controller 29.

Figure 4:
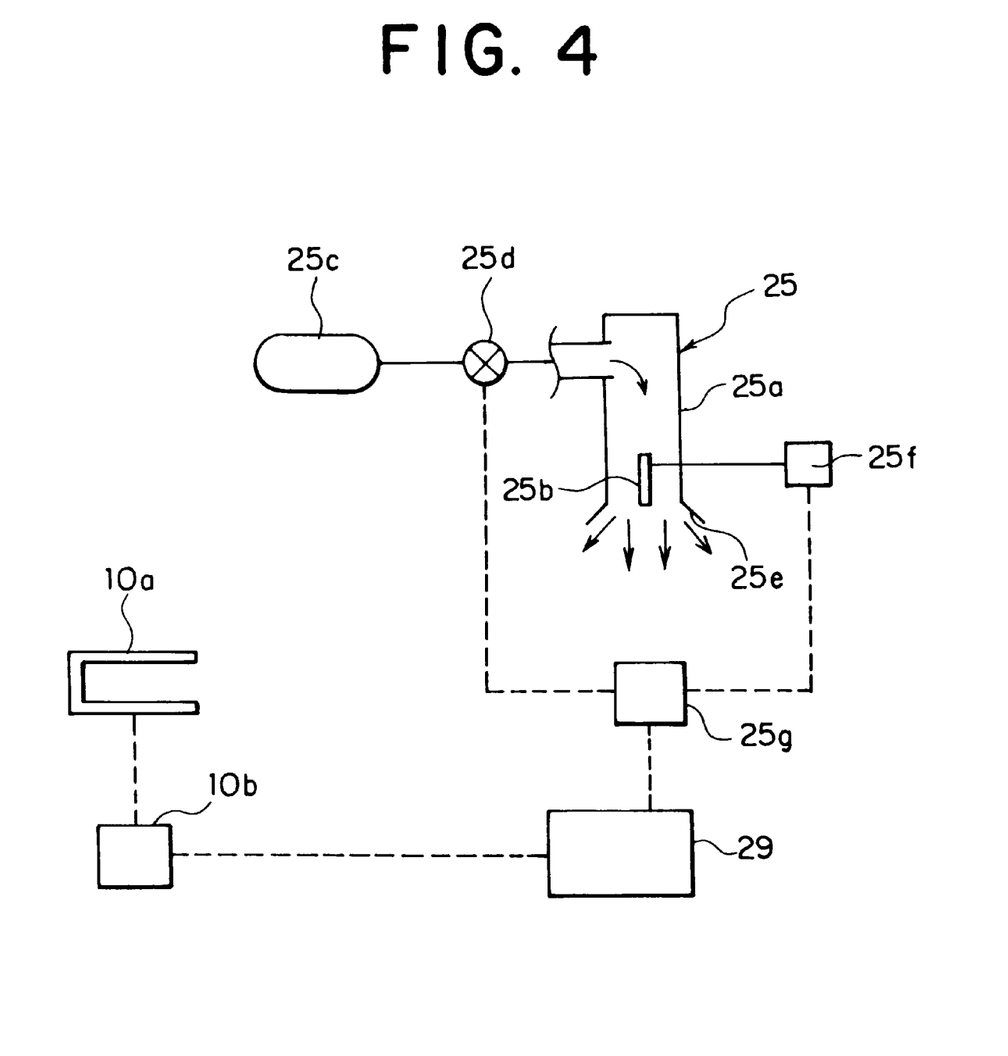
FIG. 4 is a block diagram showing the control system of an ionizer used in the first embodiment of the treatment device of the present invention.

Referring to FIG. 4, the ionizer 25 will be described below in detail. The ionizer 25 comprises a case 25a containing a discharge electrode 25b. A gas supplied from a gas supply source 25c is introduced into the case 25a through a valve 25d and blown out from a blow-off hole 25e. When the discharge electrode 25b is discharged at this time, the gas is ionized. The discharge electrode 25b is discharged by an electric power supplied from a power supply 25f. A control device 25g controls the opening and closing of the valve 25d and ON and OFF of the power supply 25f. The drive of the main arm 10 is controlled by a control device 10b. The controller 29 controls the operation of the control device 25g upon receipt of signals transmitted thereto from the control device 10b. Thus, based on the operation of a main arm 10a, the controller 29 controls the operation of the ionizer 25.

Figure 5A:
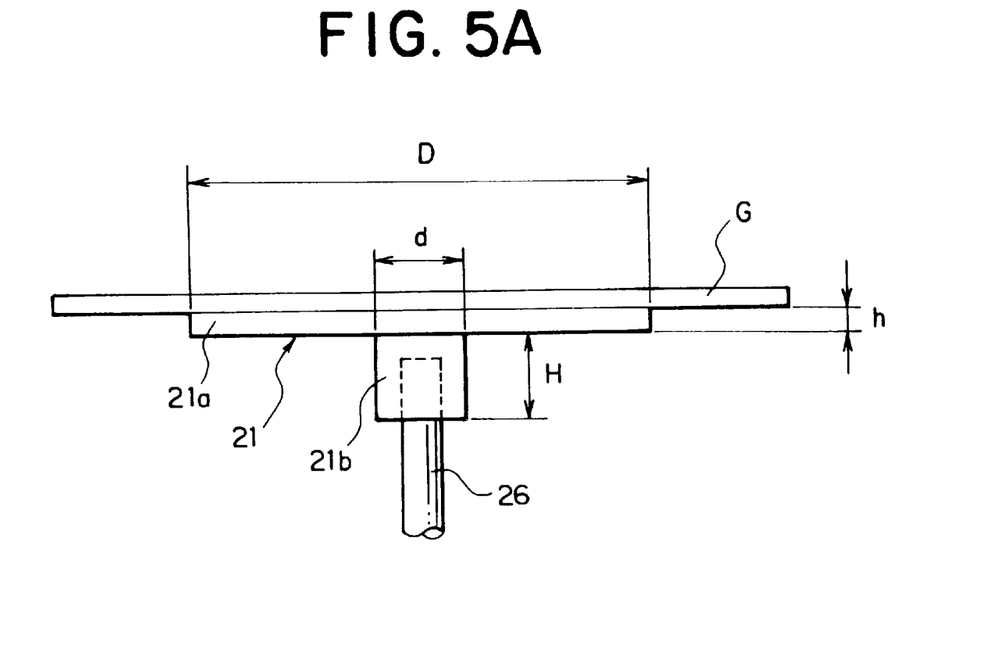
FIG. 5A is a side elevation showing a spin chuck of the present invention.

As shown in FIGS. 2 and 5A, the spin chuck 21 comprises a placing portion 21a to place a substrate G thereon and a rotation shaft-installing boss 21b projecting downward from the center of the lower surface of the substrate-placing portion 21a. The substrate-placing portion 21a is formed of a synthetic resinous material such as polyphenylene sulfide (PPS), whereas the boss 21b is formed of a metallic material such as stainless steel (SUS). The spin chuck 21 having the construction can be regarded as a capacitor in which the substrate-placing portion 21a which is a dielectric is sandwiched between an electrode formed of the substrate G and an electrode formed of the boss 21b. The spin chuck 21 is connected with a motor 27 through the rotation shaft 26 installed on the boss 21b. The spin chuck 21 is movable vertically by an unshown elevating means. The spin chuck 21 is connected with an unshown vacuum pump, thus sucking the substrate G placed on the substrate-placing portion 21a under vacuum.

The diameter d of the boss 21b is set to be a possible shortest length relative to the diameter D of the substrate-placing portion 21a and further, the thickness h of the substrate-placing portion 21a is set to be as great as possible in consideration of the space occupied by the spin chuck 21 and the permissible strength of the spin chuck 21. For example, the diameter D of the substrate-placing portion 21a is set to 300 mmφ; the diameter d of the boss 21b is set to 30 mmφ; and the thickness h of the substrate-placing portion 21a is set to 9 mm. The thickness H of the boss 21b is set to 30 mm. In this case, the electrostatic capacity C of the spin chuck 21 is expressed by an equation (1) shown below:

$$C = \epsilon \times S/h \; [F; \text{farad}] \tag{1}$$

where C is the electrostatic capacity of the spin chuck 21, ε is dielectric constant, h is the thickness of the substrate-placing portion 21a, and S is the surface area of the boss 21b.

As indicated by the equation (1), the electrostatic capacity C of the spin chuck 21 can be allowed to be small by reducing the surface area S of the boss 21b constituting an electrode and increasing the thickness h of the substrate-placing portion 21a constituting a dielectric.

Figure 5B:
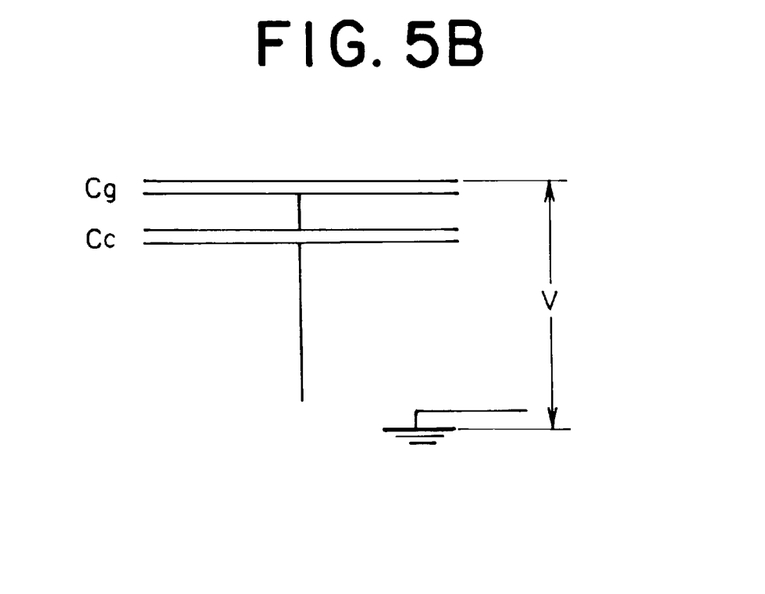
FIG. 5B is a view showing an equivalent circuit at the time when a substrate and the spin chuck are charged.

As shown in FIG. 5B, the following is the entire electrostatic capacity Call of the capacitor comprising the substrate-placing portion 21a constituting the capacitor and the substrate G also constituting the capacitor when the substrate-placing portion 21a and the substrate G are connected with each other in series:

$$\text{Call} = Cc \times Cg / (Cc + Cg) \tag{2}$$

where Cc is the electrostatic capacity of the substrate-placing portion 21a, and Cg is the electrostatic capacity of the substrate G. As apparent from the equation (2), the entire electrostatic capacity Call can be allowed to be smaller than that of the electrostatic capacity Cc of the substrate-placing portion 21a and the electrostatic capacity Cg of the substrate G.

Supposing that the electric potential of an electric charge generated by the friction between the rinsing liquid consisting of pure water and the substrate G is V, the electric charge Qall which is stored in the substrate G and the substrate-placing portion 21a is expressed as follows:

$$Qall=(Cc \times Qg+Cg \times Qc)/(Cc+Cg) \qquad (3)$$

where Qg is the electric charge of the substrate G, and Qc is the electric charge of the substrate-placing portion 21a. The equation (3) can be expressed as follows:

$$Qall=Call \times V$$

Because V is the electric potential of the electric charge generated by the friction which occurs between the rinsing liquid and the substrate G, the electric potential V is constant supposing that the substrate G is treated in the same treating condition. Accordingly, the electric charge Qall, namely, the electric charge Qg of the substrate G can be reduced by decreasing the electrostatic capacity Call.

The developing solution supply nozzle 22 is connected with a developing solution storing tank 40 through a developing solution supply tube 28. The developing solution is supplied to the developing solution supply nozzle 22 by driving a pump 41 mounted on the developing solution supply tube 28 and by opening and closing a valve 42 mounted thereon. The developing solution supply nozzle 22 comprises an unshown developing solution storing chamber having approximately the same length as that of the substrate G. A plurality of developing solution exhaust ports is formed at appropriate intervals on the lower surface of the developing solution storing chamber.

As shown in FIG. 3, the cleaning liquid supply nozzle 23 has a head 23b installed at the front end of an arm 23a which is horizontally pivotally mounted on the pivot of the cleaning liquid supply nozzle 23. The head 23b is oblique from the arm 23a to improve the cleaning efficiency of the cleaning liquid supply nozzle 23. An unshown bottomed cylindrical mesh is installed at the front end of the head 23b so that the mesh holds the rinsing liquid consisting of pure water therein owing to capillarity which occurs when the rinsing liquid is stopped from being discharged from the cleaning liquid supply nozzle 23. Therefore, it is possible to prevent the rinsing liquid from falling in large drops. The cleaning liquid supply nozzle 23 may be linearly moved similarly to the developing solution supply nozzle 22, although it pivots horizontally in the embodiment as shown in FIG. 3.

The container 30 comprises a lower container 31 located below the spin chuck 21 and the substrate G; and an outer container 32 located in the periphery of the spin chuck 21 and the substrate G. A gas exhaust port 33 connected with an unshown exhaust device projects downward from the lower surface of the lower container 31. A liquid exhaust port 34 projects downward from the lower surface of the outer container 32.

The ionizer 25 is situated above the spin chuck 21. The ionizer 25 generates ionized gas having polarities different from those of the electric charges on substrate G and the spin chuck 21, thus spraying it to the substrate G and the spin chuck 21 to destaticize the substrate G and the spin chuck 21 which have been charged.

The operation of the treatment device having the construction is described below. When the main arm 10 transports the substrate G to the developing device 20, the spin chuck 21 moves upward to receive and hold the substrate G by sucking it thereto under vacuum generated by the vacuum pump. Then, the main arm 10 moves away from the developing device 20, and then the spin chuck 21 moves downward. Thereafter, the pump 41 is driven and the developing solution supply nozzle 22 is moved along the shorter side or the longer side of the substrate G, thus supplying the surface of the substrate G with the developing solution to form the layer of the developing solution on the surface thereof.

Then, the developing solution supply nozzle 22 is moved backward to a waiting position. A developing treatment for the substrate G is performed for a predetermined period of time, with the substrate G stationary on the spin chuck 21. Then, the cleaning liquid supply nozzle 23 is moved over the substrate G to supply it with the rinsing liquid, and the motor 27 is driven to rotate the spin chuck 21. As a result, the developing solution which has remained on the substrate G is washed away with the rinsing liquid. Then, the cleaning liquid supply nozzle 23 is stopped from supplying the rinsing liquid, and pivots to a waiting position. Then, the spin chuck 21 is rotated at a high speed to remove the developing solution and the rinsing liquid from the surface of the substrate G by a centrifugal force. Then, the surface of the substrate G is dried. In this manner, the developing treatment is completed.

At this time, the substrate G and the spin chuck 21 are charged owing to the friction between the rinsing liquid and the substrate G as well as the spin chuck 21 because the substrate G is made of an insulation material. The developing device 20 develops the substrates G which are delivered thereto one after another by the main arm 10a. Thus, when the developing treatment is performed on the first substrate G placed on the spin chuck 21 before the spin chuck 21 is charged, the substrate G and the spin chuck 21 are charged slightly due to the friction between the rinsing liquid and the substrate G as well as the spin chuck 21. Thereafter, the main arm 10a takes out the developed substrate G from the developing device 20, and the undeveloped substrate G is loaded into the developing device 20. The developed substrate G transferred from the spin chuck 21 to the main arm 10a is transported to a subsequent treatment section. During the time period between the time when the developed substrate G is taken out from the developing device 20 and the time when the undeveloped substrate G is loaded thereinto, the ionizer 25 is driven under the control of the controller 29, thus spraying the ionized gas to the spin chuck 21 to destaticize the spin chuck 21 which has been charged. Consequently, in the continuous developing treatment, the substrate G can be treated, with the spin chuck 21 not being charged. Accordingly, it is possible to charge the substrate G to a slight degree because of the friction which occurs between the substrate G and the rinsing liquid only in the initial state of the developing treatment, which prevents a device formed in the substrate G from having static electricity-caused troubles and the control system of the transport means from having discharge-caused noise troubles.

Unless the spin chuck 21 which has been charged is destaticized by means of the ionizer 25 during the time period between the time when the developed substrate G is taken out from the developing device 20 and the time when the undeveloped substrate G is loaded thereinto, the spin chuck 21 is increasingly charged, as the developing device 20 develops the substrates G one after another. As a result, the substrates G are charged increasingly due to the friction between the rinsing liquid and the substrate G during the cleaning period of time in which the spin chuck 21 is spinning. Thus, there is a possibility that the device formed in the substrate G is electrostatically destroyed by the electric charge generated in the substrate G. Further, noises are generated when the electric charge generated in the substrate G is discharged to the transport means of the treatment device, thus causing the control system of the transport means to have discharge noise-caused troubles.

Second Embodiment

Figure 6:
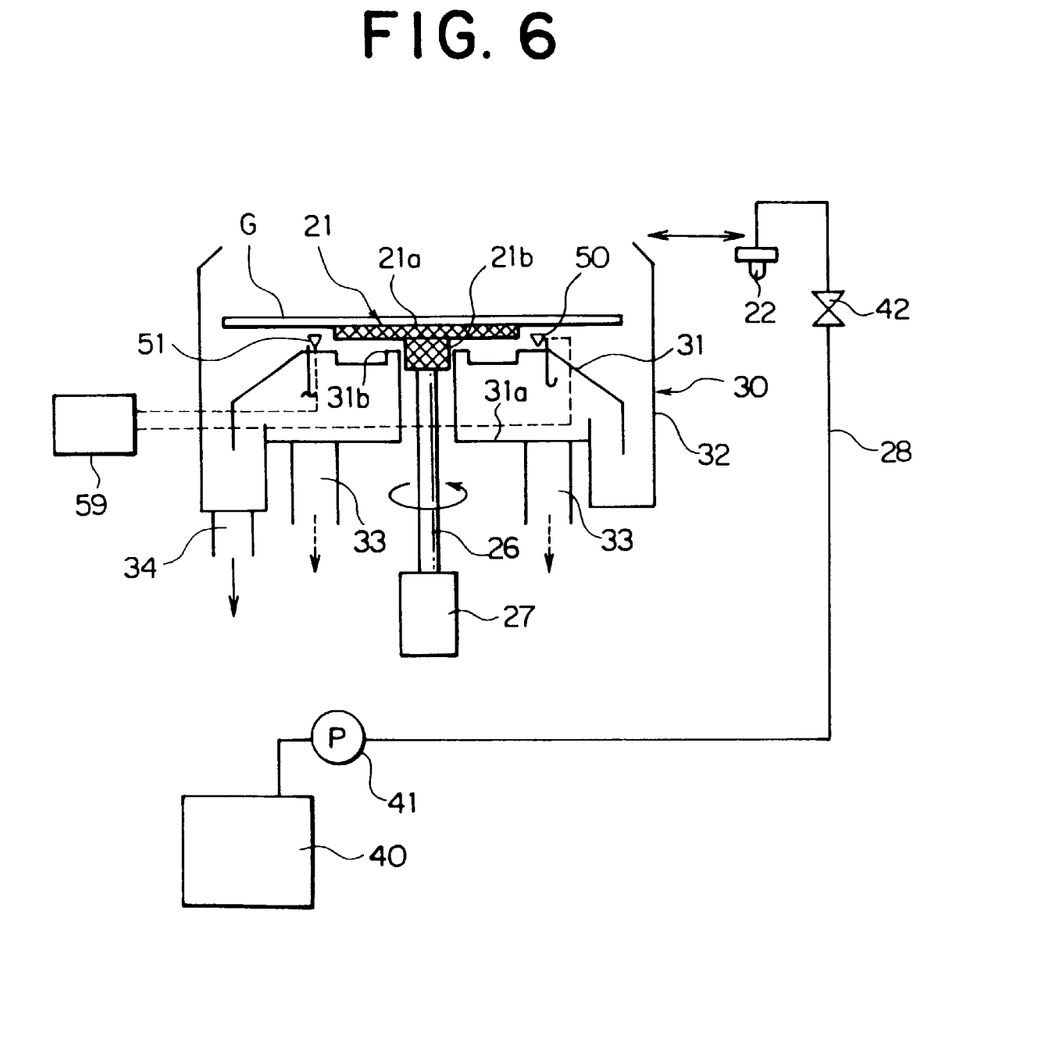
FIG. 6 is a sectional view showing a second embodiment of the treatment device of the present invention.
Figure 7:
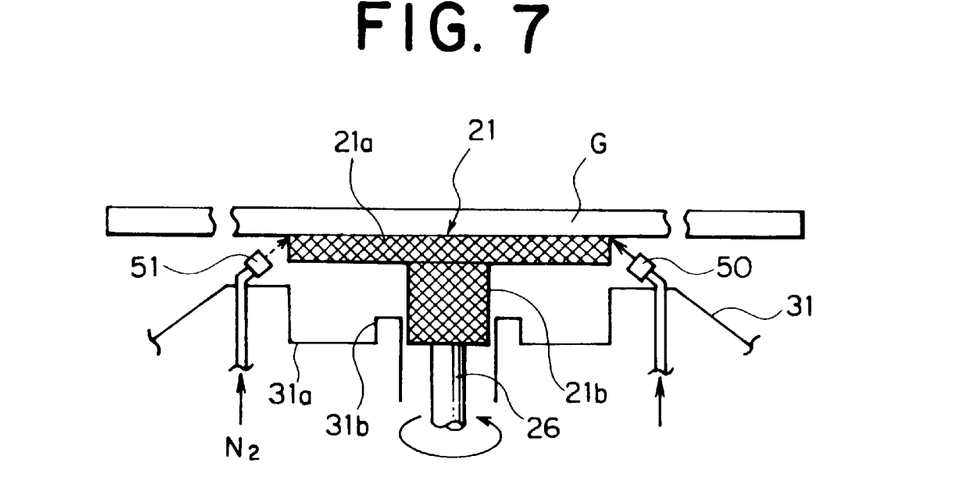
FIG. 7 is a sectional view showing main portions of the treatment device of the second embodiment.

FIG. 6 is a sectional view showing a second embodiment of the treatment device of the present invention. FIG. 7 is a sectional view showing main portions of the treatment device.

In the second embodiment, a destaticizing fluid is supplied from a position located below the spin chuck 21 to destaticize the spin chuck 21 and the substrate G which have been charged. That is, a pure water supply nozzle 50 (destaticizing fluid supply means) which jets the destaticizing fluid, for example, pure water to the spin chuck 21 and the substrate G is installed on the lower container 31 positioned below the spin chuck 21 to destaticize the spin chuck 21 and the substrate G which have teen charged. A controller 59 controls the pure water-jetting timing.

Figure 8:
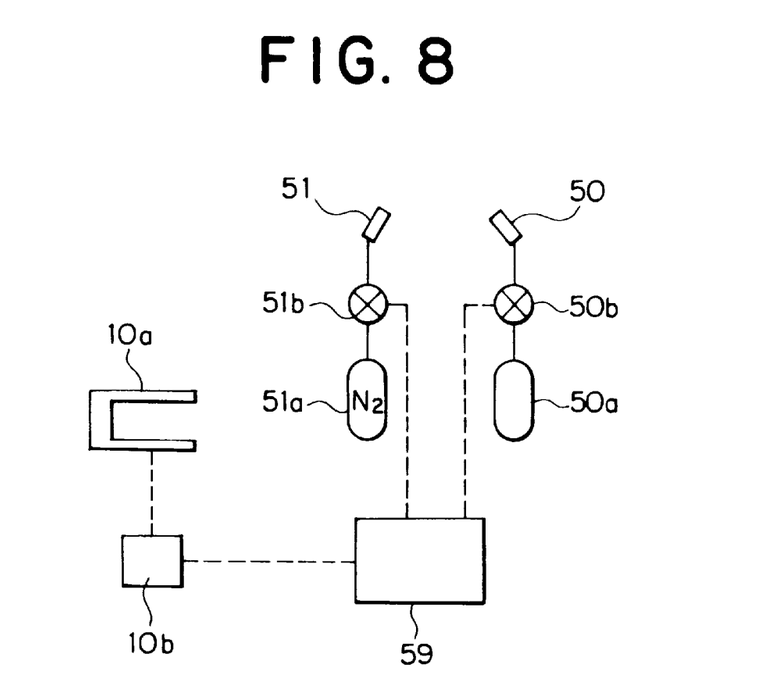
FIG. 8 is a block diagram showing the control system of a controller used in the second embodiment.

FIG. 8 shows the control system of the controller 59. The pure water supplied from a pure water supply source 50a is supplied to the spin chuck 21 and the substrate G from the pure water supply nozzle 50 through a valve 50b. Nitrogen gas supplied from a nitrogen gas supply source 51a is blown out to the spin chuck 21 and the substrate G from a dry gas supply nozzle 51 through a valve 51b. The controller 59 controls the opening and closing of the valves 50b and 51b. Thus, the controller 59 controls the spraying operation of the pure water supply nozzle 50 and the nitrogen gas supply source 51a, based on the operation of the main arm 10a.

As shown in FIGS. 6 and 7, the lower container 31 has an erect wall 31b in the inner peripheral side of a horizontal bottom 31a located below the spin chuck 21. The erect wall 31b prevents the pure water jetted from the pure water supply nozzle 50 from penetrating into the rotation shaft side of the spin chuck 21. In order to completely prevent the pure water from penetrating into the rotation shaft side, it is preferable to form a high-pressure atmosphere at the rotation shaft side by flowing nitrogen gas or air between the rotation shaft 26 and the container 30.

A dry gas supply nozzle 51 which supplies a dry gas such as nitrogen gas to the spin chuck 21 is situated at a position below the spin chuck 21, for example, a position opposite to the position at which the pure water supply nozzle 50 is situated. A portion of the spin chuck 21 wetted with the pure water jetted from the pure water supply nozzle 50 is dried at a high speed by the nitrogen gas jetted between the spin chuck 21 and the substrate G from the dry gas supply nozzle 51. As described above, the controller 59 controls the jetting timing of the dry gas which is jetted from the dry gas supply nozzle 51.

Because the constructions of other members of the second embodiment are the same as those of the first embodiment, the same parts of the second embodiment as those of the first embodiment are denoted by the same reference numerals of the first embodiment and the descriptions thereof are omitted herein.

In the treatment device of the second embodiment having the construction, when the developing solution and the rinsing liquid which have attached to the surface of the developed substrate G are removed by the centrifugal force generated by a high-speed rotation of the spin chuck 21, pure water is jetted from the pure water supply nozzle 50 to the spin chuck 21 and the substrate G to destaticize the spin chuck 21 and the substrate G which have been charged. Further, the lower surface of the spin chuck 21 and that of the substrate G wetted with the pure water can be dried preferably by jetting the dry nitrogen gas from the dry gas supply nozzle 51 to the space between the spin chuck 21 and the substrate G, simultaneously with the jetting timing of the pure water to the spin chuck 21 and the substrate G. The jetting timing of the nitrogen gas which is discharged front the dry gas supply nozzle 51 is not necessarily coincident with the supply timing of the pure water. The jetting timing of the nitrogen gas may lag behind the supply timing of the pure water or started after the supply of the pure water to the spin chuck 21 and the substrate G is stopped. It is also possible to supply the pure water thereto during the supply of the pure water and after the supply thereof is stopped.

Other Embodiments (1) In the first and second embodiments, the boss 21b is formed of a metal material, but may be formed of a synthetic resinous material such as PPS. It is possible to form the substrate-placing portion 21a and the boss 21b of a synthetic resinous material such as the PPS and integrate them with each other. In this case, it is possible to allow the thickness the dielectric consisting of the substrate-placing portion 21a and the boss 21b to be thick so as to allow the substrate G to be charged in a small amount.

(2) In the first and second embodiments, the ionized gas and the pure water are used as the destaticizing fluid. But the charged substrate G and the spin chuck 21 may be irradiated with soft X-rays to destaticize charged substrate G and the spin chuck 21 which have been charged. In addition, a volatile liquid such as isopropyl alcohol (IPA) may be used as a destaticizing fluid instead of the pure water. The use of the isopropyl alcohol (IPA) eliminates the need for the adoption of the dry gas supply means, this allowing the number of the component parts to be reduced and the treatment device to be compact. It is also possible to use purified air instead of nitrogen gas.

(3) In the first and second embodiments, the treatment device of the present invention is applied to the LCD substrate-developing device, but applicable to other devices such as a resist-applying device. Needless to say, the treatment device of the present invention may be applied to treatment devices for treating semiconductor wafers and CD.

EXAMPLE

Experiments were conducted to examine the charged amount of a spin chuck made of aluminum alloy; a spin chuck, of the present invention, made of a synthetic resinous material; and a spin chuck, of the present invention, made of the synthetic resinous material and destaticized by ionized gas.

Experimental Condition:

Comparative sample: Spin chuck made of aluminum alloy

Example 1: Spin chuck made of polyphenylene sulfide (see FIG. 5A)

Figure 9:
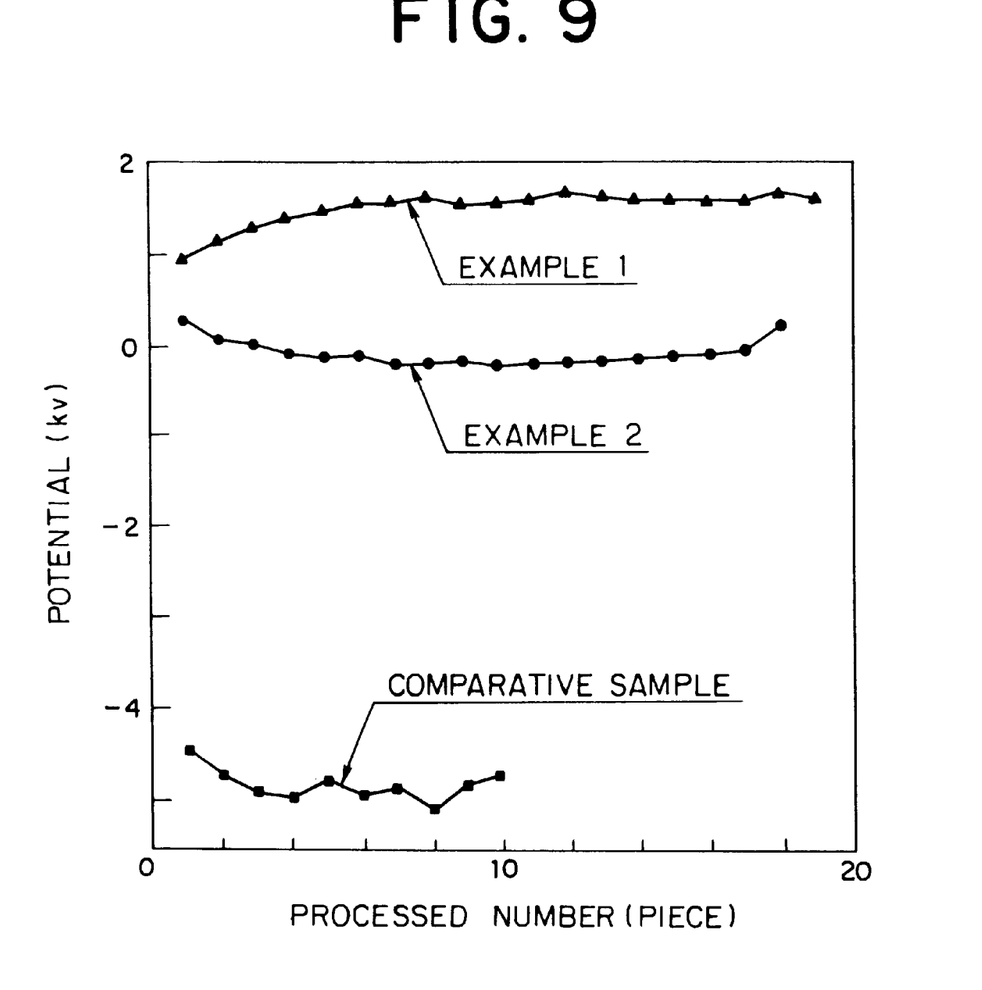
FIG. 9 is a graph showing the relationship between the number of treated substrates and an electric potential of a conventional spin chuck, a spin chuck of the present invention, and the spin chuck of the present invention to which a destaticizing fluid is supplied.

Diameter D of substrate-placing portion 21a=300 mmφ; thickness H thereof=9 mm; diameter d of boss 21b=300 mmφ; thickness h thereof=30 mm Example 2: Spin chuck of the first embodiment was irradiated with ionized gas Rinsing period of time: 20 seconds The spin chuck of the comparative example, that of the example 1, and that of the example 2 were used to develop the substrates G in the same condition so as to examine the relationship between the number of the substrates G and the charged amount (electric potential) of the spin chucks. The result is shown in the graph of FIG. 9.

In the case of the conventional spin chuck made of the aluminum alloy, the electric potential of the spin chuck was from about −4.5 kV to −5 kV, irrespective of the number thereof. In the case of the spin chuck made of the polyphenylene sulfide of the first example, the electric potential of the spin chuck was about +1 kV at the start time of the developing treatment but increased gradually, thus reaching about +1.5 kV with the increase in the number of the substrates G to 10 and kept the voltage of about +1.5 thereafter. In the case of the spin chuck of the example 2, the electric potential of the spin chuck was about 0 kV, which means that the ionized gas is effective for destaticizing the substrate G.

As apparent from the foregoing description, the following advantages can be obtained. Because the electric charge amount of a substrate which is treated can be reduced, it is possible to prevent occurrence of various static electricity-caused troubles such as electrostatic destruction of a device formed in the substrate. It is possible to prevent noises generated by a discharge which occurs between the substrate and the transport means from giving a trouble to a control system of a transport means. Moreover, because it is possible to destaticize a holding means, such a superior effect can be obtained when the treatment device of the present invention is continuously used.

Although the present invention has been shown and described with respect to a best mode embodiment thereof, it should be understood by those skilled in the art that the foregoing and various other changes, omissions, and additions in the form and detail thereof may be made therein without departing from the spirit and scope of the present invention.

What is claimed is:

1. A treatment device comprising:
    a holding means for holding a substrate which is to be treated, wherein the holding means has a substrate-placing portion and a rotation shaft-installing boss projecting from a center of a lower surface of the substrate-placing portion, the substrate-placing portion and the boss being made of a synthetic resinous material; and
    a treatment solution supply means for supplying a surface of said substrate with a treatment solution.

2. The treatment device as set forth in claim 1, wherein said substrate is made of an insulating material.

3. The treatment device as set forth in claim 1, wherein said synthetic resinous material is polyphenylene sulfide.

4. The treatment device as set forth in claim 1, further comprising a destaticizing fluid supply means for supplying a destaticizing fluid to said substrate-placing portion.

5. The treatment device as set forth in claim 4, wherein said destaticizing fluid is ionized pure water.

6. The treatment device as set forth in claim 4, wherein said destaticizing fluid is isopropyl alcohol.

7. The treatment device as set forth in claim 4, wherein said destaticizing fluid is an ionized gas.

8. The treatment device as set forth in claim 4, further comprising a control means for flowing the destaticizing fluid in a period of time between the time when a developed substrate is taken out from a developing device and the time when an undeveloped substrate is loaded thereinto.

9. The treatment device as set forth in claim 1, further comprising a destaticizing fluid supply means for supplying a destaticizing fluid to said substrate-placing portion; and
    a dry gas supply means, positioned above or below said holding means, for supplying a dry gas to said holding means.

10. The treatment device as set forth in claim 9, wherein said dry gas is nitrogen gas.

11. The treatment device as set forth in claim 9, wherein said dry gas is purified air.

12. A treatment device comprising:
    a holding means for holding a substrate which is to be treated, wherein the holding means has a substrate-placing portion, the substrate-placing portion being made of a synthetic resinous material;
    a treatment solution supply means for supplying a surface of said substrate with a treatment solution;
    a destaticizing fluid supply means for supplying a destaticizing fluid to said substrate-placing portion; and
    a control means for flowing the destaticizing fluid in a period of time between the time when a developed substrate is taken out from a developing device and the time when an undeveloped substrate is loaded thereinto.

13. The treatment device as set forth in claim 12, wherein said destaticizing fluid is ionized pure water.

14. The treatment device as set forth in claim 12, wherein said destaticizing fluid is isopropyl alcohol.

15. The treatment device as set forth in claim 12, wherein said destaticizing fluid is an ionized gas.

16. A treatment device comprising:
    a holding means for holding a substrate which is to be treated, the holding means having a substrate-placing portion and a rotation shaft-installing boss projecting from a center of a lower surface of said substrate-placing portion, the substrate-placing portion being made of a synthetic resinous material, the boss being made of a metal material, the diameter of the boss being shorter than that of said substrate-placing portion; and
    a treatment solution supply means for supplying a surface of said substrate with a treatment solution.

17. The treatment device as set forth in claim 16, wherein said substrate is made of an insulating material.

18. The treatment device as set forth in claim 16, wherein said boss is made of stainless steel.

19. The treatment device as set forth in claim 16, further comprising a destaticizing fluid-supply means for supplying a destaticizing fluid to said substrate-placing portion.

20. The treatment device as set forth in claim 19, wherein said destaticizing fluid is ionized pure water.

21. The treatment device as set forth in claim 19, wherein said destaticizing fluid is isopropyl alcohol.

22. The treatment device as set forth in claim 19, wherein said destaticizing fluid is an ionized gas.

23. The treatment device as set forth in claim 16, further comprising a destaticizing fluid-supply means for supplying a destaticizing fluid to said substrate-placing portion; and a dry gas supply means, positioned above or below said holding means, for supplying a dry gas to said holding means.

24. The treatment device as set forth in claim 23, wherein said dry gas is nitrogen gas.

25. The treatment device as set forth in claim 23, wherein said dry gas is purified air.

26. A treatment device comprising:

a holding unit that holds a substrate which is to be treated, the holding unit having a substrate placing portion and a rotation shaft-installing boss projecting from a center of a lower surface of the substrate placing portion, the substrate placing portion and the boss being made of a synthetic resinous material; and a treatment solution supply unit that supplies a surface of said substrate with a treatment solution.

27. The treatment device according to claim 26, wherein the holding unit includes a spin chuck and the treatment solution supply unit includes a nozzle.

28. A treatment device comprising:

a holding unit that holds a substrate which is to be treated, the holding unit having a substrate placing portion and a rotation shaft installing boss projecting from a center of a lower surface of the substrate placing portion, the substrate placing portion and the boss being made of a synthetic resinous material;

a treatment solution supply unit that supplies a surface of said substrate with a treatment solution;

a destaticizing fluid supply unit that supplies a destaticizing fluid to said substrate placing portion; and a control unit that controls the flow of the destaticizing fluid in a time period between the time when a developed substrate is taken out from a developing device and a time when an undeveloped substrate is loaded thereinto.

29. The treatment device according to claim 28, wherein the holding unit includes a spin chuck, the treatment solution supply unit includes a nozzle and the destaticizing fluid supply unit includes an ionizer.

* * * * *